United States Patent
Nguyen (10) Patent No.: US 11,150,295 B1
(45) Date of Patent: Oct. 19, 2021

(54) RELAY CIRCUIT FOR REDUCING A VOLTAGE GLITCH DURING DEVICE TESTING

(71) Applicant: Marvell Asia Pte, Ltd., Singapore (SG)

(72) Inventor: Quang Nguyen, Irvine, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 77 days.

(21) Appl. No.: 16/590,581

(22) Filed: Oct. 2, 2019

Related U.S. Application Data (60) Provisional application No. 62/740,290, filed on Oct. 2, 2018.

(51) Int. Cl.
*G01R 31/28* (2006.01)
*H01H 50/44* (2006.01)

(52) U.S. Cl.
CPC ..... *G01R 31/2896* (2013.01); *G01R 31/2834* (2013.01); *G01R 31/2844* (2013.01); *H01H 50/44* (2013.01)

(58) Field of Classification Search
CPC ...... G06F 2119/06; G06F 21/755; G06F 1/26; G06F 1/3296; G01R 31/2633; G01R 31/3004; G01R 31/2853; G01R 31/31721; G01R 31/31926; G01R 31/2896; G01R 31/2834; G01R 31/2844; G01R 19/18509; G05B 13/042; G05B 2219/25242; G05F 1/46; G05F 3/262; H01H 50/44; H04Q 2213/02; H04Q 2123/1302; H02M 3/156
See application file for complete search history.

(56) References Cited

U.S. PATENT DOCUMENTS

| | | | | |
|---|---|---|---|---|
| 3,976,940 A * | 8/1976 | Chau | ............... | G01R 19/16519 714/736 |
| 4,833,341 A * | 5/1989 | Watanabe | .............. | G11C 5/147 327/541 |
| 6,675,330 B1 * | 1/2004 | Levy-Kendler | .... | G01R 31/3004 714/724 |
| 7,417,482 B2 * | 8/2008 | Elgebaly | ................. | G06F 1/324 327/278 |
| 7,793,119 B2 * | 9/2010 | Gammie | ................... | G06F 1/26 713/300 |
| 8,370,654 B1 * | 2/2013 | Hasko | ....................... | G06F 1/26 713/300 |
| 8,952,671 B2 * | 2/2015 | Shimizu | .................. | G05F 1/575 323/283 |
| 8,972,755 B1 * | 3/2015 | Hasko | ................... | H02M 3/156 713/300 |
| 9,086,453 B2 * | 7/2015 | Bourstein | ........ | G01R 31/31721 |

\* cited by examiner

*Primary Examiner* — Vinh P Nguyen (57) ABSTRACT

A system includes a power supply configured to adjust a voltage supplied to a device under test (DUT) based on one of an input voltage of the DUT supplied to a power supply sense input of the power supply and a feedback signal indicative of an internal voltage of the DUT supplied to the power supply sense input, and a relay circuit configured to transition between supplying the input voltage to the power supply sense input and supplying the feedback signal to the power supply sense input. When supplying the feedback signal to the power supply sense input, the relay circuit establishes an electrical path between the input voltage and the power supply sense input to prevent the power supply sense input from floating during the transition.

19 Claims, 4 Drawing Sheets

RELAY CIRCUIT FOR REDUCING A VOLTAGE GLITCH DURING DEVICE TESTING

CROSS REFERENCE TO RELATED APPLICATION

This disclosure claims the benefit of priority under 35 U.S.C. § 119(e) of U.S. Provisional Application Ser. No. 62/740,290 filed Oct. 2, 2018 entitled, "Method and Apparatus for Implementing a Relay Circuit of a Loadboard", the contents of which is incorporated herein by reference in its entirety.

FIELD OF USE

This disclosure generally relates to the field of electronic testing, and more particularly to a relay circuit arranged to reduce a glitch in a voltage output by a power supply which powers a device under test (DUT) during switching of signals provided to a power supply sense input.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A device under test (DUT) is a manufactured product undergoing testing, either at first manufacture or later during its life cycle as part of ongoing functional testing and calibration checks. The DUT includes systems on chips and integrated circuits which are tested after manufacture or after repair to establish that the DUT is performing in accordance with an original specification.

The DUT is coupled to a power supply which powers the DUT. The power supply has a voltage output and a power supply sense input. The voltage output outputs a voltage which is provided to the DUT. The power supply adjusts the voltage output based on a signal at the power supply sense input which indicates whether a desired voltage is met. For example, if the power supply outputs 1 volt and the signal at the power supply sense input indicates 0.95 volts, then the power supply increases its output voltage until the signal at the power supply sense input indicates a desired voltage such as 1 volt. As another example, if the power supply outputs 1.10 volt and the signal at the power supply sense input indicates 1.05 volts, then the power supply decreases its output voltage until the signal at the power supply sense input indicates a desired voltage such as 1 volt.

A relay switches to provide different signals to the power supply sense input of the power supply to test the DUT. The signals may include an indication of a voltage input at the DUT and an adaptive voltage scaling (AVS) feedback of the DUT indicative of an internal voltage of the DUT. The power supply adjusts the voltage output based on the signal provided to the power supply sense input. If the relay circuit provides the indication of the voltage input at the DUT to the power supply sense input, then the power supply adjusts the voltage output based on the power supply sense input so that the voltage input at the DUT is at the desired voltage. Alternatively, if the relay circuit provides the AVS feedback to the power supply sense input, then the power supply adjusts the voltage output based on the power supply sense input so that the internal voltage at the DUT indicated by the AVS feedback is at the desired voltage.

As the relay circuit switches between providing the AVS feedback and the indication of the voltage input at the DUT to the power supply sense input, the power supply sense input floats for a short period of time. The floating power supply sense input causes the power supply to overshoot or undershoot adjustment of the voltage output producing a glitch in the output voltage. The glitch remains until the power supply sense input no longer floats and the relay circuit provides the AVS feedback or the indication of the voltage input at the DUT to the power supply sense input.

SUMMARY

This disclosure relates to the field of electronic testing, and more particularly to a relay circuit arranged to reduce a glitch in a voltage output of a power supply which powers a device under test (DUT) as the relay circuit switches between providing different signals to a power supply sense input.

Aspects of the disclosure provide a system comprising: a power supply which outputs a voltage based on a power supply sense input; a device under test (DUT); and a relay circuit, wherein the relay circuit comprises: a first switch arranged to provide a first signal of the DUT to the power supply sense input of the power supply when the relay circuit is in a first state and to a resistor coupled to the power supply sense input when the relay circuit is in a second state; a second switch arranged to provide a second signal of the DUT to the power supply sense input of the power supply when the relay circuit is in the second state; and a path arranged to provide the first signal of the DUT to the resistor coupled to the power supply sense input during a transition between the first state and the second state. In one example, the relay circuit further comprises a coil. In another example, a voltage is applied across the coil to cause the relay circuit to transition from the first state to the second state. In yet another example, the system comprises automatic test equipment (ATE) which outputs a voltage to the coil when the relay circuit is in the second state. In another example, the second switch is arranged to provide the second signal to a parametric test input of ATE when the relay circuit is in the first state. In yet another example, the system further comprises a loadboard, wherein the loadboard further comprises a power plane to provide the output voltage to the DUT, and the DUT is coupled to the power plane by a trace though a via of the loadboard to the power plane. In another example, the first signal is provided to the power supply sense input when the second signal is floating in the second state. In yet another example, the first signal is indicative of a voltage input at the DUT and the second signal is an adaptive voltage scaling (AVS) feedback. In another example, the power supply sense input is not floating when the relay circuit is in the first state, the second state, and the transition between the first state and the second state. In yet another example, the second signal of the DUT is provided to a resistor coupled to an input of the second switch.

Aspects of the disclosure provide a relay circuit comprising a first switch arranged to provide a voltage input at a device under test (DUT) to a power supply sense input of a power supply when the relay circuit is in a first state and to a resistor coupled to the power supply sense input when the relay circuit is in a second state; a second switch arranged to provide an AVS feedback of the DUT to the power supply sense input of the power supply when the relay circuit is in the second state; and a path arranged to provide the voltage input at the DUT to the resistor coupled to the power supply sense input during a transition between the first state and the second state. In one example, the relay circuit further comprises a coil. In another example, the voltage input at the DUT is provided to the power supply sense input when the AVS feedback is floating in the second state. In yet another example, the power supply sense input is not floating when the relay circuit is in the first state, the second state, and the transition between the first state and the second state. In another example, the AVS feedback is provided to a resistor coupled to an input of the second switch.

Aspects of the disclosure provide a method comprising: providing a first signal to a power supply sense input of a power supply in a first state; transitioning from the first state to a second state while providing the first signal to the power supply sense input of the power supply during the transition; and providing one of the first signal and a second signal to the power supply sense input of the power supply in the second state. In one example, the method further comprises transitioning from the second state to the first state while providing the first signal to the power supply sense input of the power supply during the transition. In another example, the first signal is indicative of a voltage input at a DUT and the second signal is an AVS feedback. In yet another example, the method of providing one of the first signal and the second signal to the power supply sense input of the power supply in the second state comprises providing the first signal to the power supply sense input when the second signal is floating in the second state. In another example, the power supply sense input is not floating in the first state, the second state, and the transition between the first state and the second state.

In this regard, the disclosed relay circuit allows for reducing glitches in a voltage output by the power supply during testing of the DUT as the power supply adjusts the voltage output based on the power supply sense input.

The drawings are for the purpose of illustrating example embodiments, but it is understood that the embodiments are not limited to the arrangements and instrumentality shown in the drawings.

DETAILED DESCRIPTION

This disclosure provides examples and details related to electronic testing. A loadboard serves as an interface between automated test equipment (ATE) and a device under test (DUT). A relay circuit of the loadboard is arranged to reduce a glitch in a voltage output by a power supply as the relay circuit switches signals provided to a power supply sense input of a power supply. The disclosed relay circuit is not limited to the switching of signals provided to the power supply. In other examples, the disclosed relay circuit may be used to switch signals other than provided to a power supply while reducing a glitch associated with a device or circuit which receives the other signals.

Figure 1:
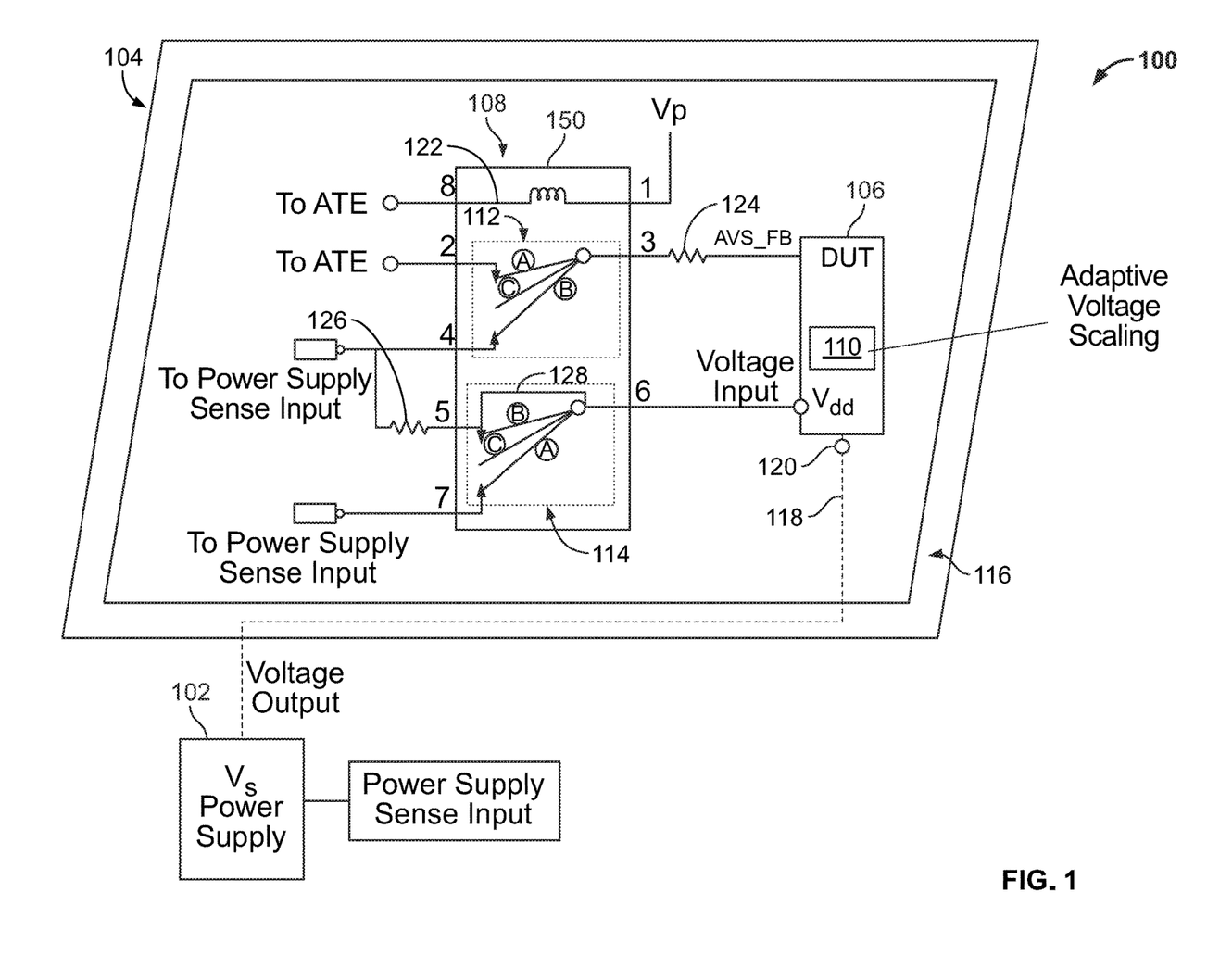
FIG. 1 illustrates an example system for reducing a glitch in a voltage output by a power supply which powers a device under test (DUT) on a loadboard.

FIG. 1 illustrates an example system 100 for reducing a glitch in a voltage output by a power supply which powers a device under test (DUT). The example system 100 may comprise a DUT 106, a power supply 102, and a relay circuit 108. The power supply 102, DUT 106, and relay circuit 108 may include hardware, software, or a combination of hardware and software for performing disclosed functions.

In examples, the DUT 106 may be a manufactured product undergoing testing, either at first manufacture or later during its life cycle as part of ongoing functional testing and calibration checks. The DUT 106 may include system on chips and integrated circuits which may be tested after manufacture or after repair to establish that the DUT 106 is performing in accordance with an original specification.

The DUT 106 may be configured with adaptive voltage scaling (AVS) 110 which is a closed-loop dynamic power minimization system to adjust voltage supplied to the DUT 106. AVS 110 allows the voltage supplied to the DUT 106, and therefore its power consumption, to be continuously adjusted to be appropriate to workload and temperature of the DUT 106, for example. To determine voltage needs of the DUT 106, the AVS 110 may determine an internal voltage of the DUT 106 and provide the indication of the internal voltage at the DUT 106 as an AVS feedback (also referred to as AVS_FB). The AVS feedback compared to a desired voltage may be indicative of the voltage need of the DUT 106. For example, if the AVS feedback is less than a desired voltage, then the DUT 106 may require a higher voltage. As another example, if the AVS feedback is greater than a desired voltage, then the DUT 106 may require a lower voltage. The AVS feedback may be accessed via a connection on the DUT 106 such as a pin, lead, or pad of the DUT 106.

In examples, the DUT 106 may be mounted on a loadboard 104. The loadboard 104 is a circuit board designed to serve as an interface circuit between automatic test equipment (ATE) (not shown) and the DUT 106 on the loadboard 104. The loadboard 104 may contain components to set up the DUT 106 for testing by the ATE, route test signals and response signals between the DUT 106 and the ATE, and provide test capabilities that the ATE is not able to provide. An ideal loadboard 104 may introduce minimal distortion, noise, delays, or errors for testing the DUT 106. This means that the ideal load board may not seem to exist at all, i.e., as if the DUT 106 were directly connected to the ATE.

The DUT 106 may be coupled to the power supply 102 which powers the DUT 106. The power supply 102 may have respective connections in the form of a pin, lead, or pad. The connections may include a voltage output (Vs) and a power supply sense input. The voltage output may output a voltage to the DUT 106. The voltage output of the power supply 102 may be coupled to the DUT 106 by a trace 118 which in some examples may be located on a power plane 116 of the loadboard 104. The power plane 116 may be a lower layer of the loadboard 104 which carries power from the power supply 102 to the DUT 106 which is mounted on an upper layer of the loadboard 104. The DUT 106 may be coupled to the trace 118 through a via 120 on the loadboard 104. The power supply may adjust the voltage output based on a signal at the power supply sense input until the power supply sense input indicates a desired voltage is met. For example, if the power supply outputs 1 volt and the signal at the power supply sense input indicates 0.95 volts, then the power supply may increase its output voltage until the signal at the power supply sense input indicates the desired voltage such as 1 volt. As another example, if the power supply outputs 1.10 volt and the signal at the power supply sense input indicates 1.05 volts, then the power supply may decrease its output voltage until the signal at the power supply sense input indicates the desired voltage such as 1 volt.

The relay circuit 108 may have one or more electrical and/or mechanical switches 112, 114 which transition between two states such as an open state and closed state to provide different signals to the power supply sense input of the power supply 102. For example, in the closed state, the switches 112, 114 may provide the AVS feedback to the power supply sense input of the power supply 102. As another example, in the open state, the switches 112, 114 may provide an indication of a voltage input at the DUT 106 to the power supply sense input. The AVS feedback to the power supply sense input of the power supply 102 is described above. The voltage input at the DUT 106 may be indicative of a voltage received by the DUT 106 from the power supply 102 via trace 118. The voltage input at the DUT 106 may be accessed via a connection on the DUT 106 such as a pin, lead, or pad of the DUT 106.

The relay circuit 108 may allow for testing the DUT 106 when the power supply 102 adjusts the voltage output based on the power supply sense input. The power supply 102 may adjust the voltage output based on the power supply sense input so that the voltage input at the DUT 106 is at the desired voltage if the relay circuit 108 provides the indication of the voltage input at the DUT 106 to the power supply sense input. Alternatively, the power supply 102 may adjust the voltage output based on the power supply sense input so that the internal voltage at the DUT 106 is at the desired voltage if the relay circuit 108 provides the AVS feedback to the power supply sense input. The power supply 102 may output a voltage compensating for one or more of resistive losses and impedance losses over the trace 118 and internal circuit losses in the DUT 106, so that the internal voltage of the DUT 106 or voltage input at the DUT 106 is at the desired voltage.

The relay circuit 108 may further include a plurality of connections 1 to 8 and a coil 122. The plurality of connections 1 to 8 may be leads, pins, or pads which couple to one or more to the coil 122 and switches 112, 114. In this regard, the switches 112, 114 and the coil 122 may be encapsulated in an integrated circuit package 150. In some examples, the coil 122 may be an electromagnet which operates in one of two states, an off state and an on state to switch the switches 112, 114 between the two states. The coil 122 may change from the on state to the off state depending on whether a voltage is applied across the coil 122. Connections 1 and 8 may be coupled to the coil 122. A voltage (Vp) may be applied to connection 1 such as 12 volts. The voltage Vp may be provided by an output of a power supply (not shown) which is different from power supply 102. Connection 8 may be a control line coupled to the ATE which allows for controlling whether the coil 122 is in the on state or off state. If the control line has a voltage of Vp, then the coil 122 may be in the off state. If the control line has a voltage of 0 volts, then the coil 122 may be in an on state.

The switches 112, 114 may provide an electrical path between one or more of connections (2,3), (3,4), (5,6), and (6,7) of the relay circuit 108. Connection 3 may be an input to the switch 112 and connections 2 and 4 may be outputs of the switch 112. Connection 6 may be an input to the switch 114 and connections 5 and 7 may be outputs of the switch 114. The input and outputs of each switch may be connected by one of electrical paths A and B.

In examples, the switches 112, 114 may switch between a first state and second state depending on a state of the coil 122. For example, when the coil 122 is in the off state, the switches 112, 114 may be in the open state, connection 3 and 2 may be connected via path A and connections 6 and 7 may be connected via path A. The relay circuit may be in a first state where the relay circuit provides the indication of the voltage input at the DUT to the power supply sense input and the AVS feedback to the ATE. As another example, when coil 122 is in the on state, the switches 112, 114 may be in the closed state, connection 3 and 4 may be connected via path B and connections 6 and 5 may be connected via path B. The relay circuit may be in a second state where the relay circuit provides the indication of the voltage input at the DUT 106 to resistor 126 coupled to the power supply sense input and the AVS feedback to the power supply sense input.

Connection 2 may be coupled to a parametric test input of the ATE and connection 3 may be coupled to the AVS feedback of the DUT 106. The parametric test input may allow for performing various tests including continuity and leakage tests for the DUT 106. Additionally, a resistor 124 may be coupled between connection 3 and the AVS feedback. The resistor 124 may have a zero resistivity, but could have a non-zero resistivity.

Connections 4, 5, and 7 may be coupled to the power supply sense input of the power supply 102. Connections 4 and 7 may be directly coupled to the power supply sense input. Connection 5 may be coupled to the power supply sense input via a resistor 126. The resistor 126 may have a non-zero resistivity such as 300 ohms. Connection 6 may be coupled to the DUT 106 to receive the voltage input at the DUT, which is shown as Vdd.

When the switches 112, 114 are in a first state such as the open state, the switch 112 may couple the AVS feedback output to the parametric test input of the ATE shown as path A. Additionally, the switch 114 may couple the voltage input at the DUT to the power supply sense input of the power supply 102 shown as path A. In this regard, the power supply 102 may output a voltage based on the indication of the voltage input at the DUT 106 when the switches 112, 114 are in the first state.

When the switches 112, 114 are in a second state such as the closed state, the switch 112 may couple the AVS feedback to the power supply sense input shown as path B and the switch 112 may couple the voltage input at the DUT 106 to the resistor 126 shown as path B. In examples, the AVS feedback may be enabled or disabled. The AVS feedback may be enabled when the AVS feedback is not floating (i.e., tied to a reference voltage) and not enabled when the AVS feedback is floating (i.e., not tied to a reference voltage). So long as the AVS feedback is enabled, the AVS feedback may be provided to the power supply sense input. The reason is that a path from the AVS feedback to the power supply sense input through connections 3 and 4 has less resistance compared to a path from the voltage at the DUT 106 to the power supply sense input via connections 5, 6, and resistor 126. The power supply 102 may provide an output voltage based on the AVS feedback. But if the AVS feedback is not enabled, the indication of the voltage input at the DUT 106 is provided to the power supply sense input and the power supply 102 may provide an output voltage based on the indication of the voltage input at the DUT 106. This way regardless of whether the AVS feedback is enabled or not, the power supply 102 may output a voltage based on a valid power supply sense input.

In examples, the switches 112, 114 may not transition from the first state to the second state and vice versa, instantaneously. As the switches 112, 114 transitions, there is a period of time when connection 3 is not connected to either of connections 2 or 4, and connection 6 is not connected to either of connections 5 or 7, shown as intermediate path C. The power supply sense input may float, meaning that power sense input is not tied to any reference voltage. The floating power supply sense may result in the power supply 102 increasing or decreasing the voltage output which produces a glitch in the output of the power supply 102. The glitch may be an overshoot of the voltage from a baseline to compensate for the floating voltage at the power supply sense input if a voltage of the power supply sense input decreases during the transition. Alternatively, the glitch may be an undershoot of the voltage from a baseline to compensate for the floating voltage at the power supply sense input if a voltage of the power supply sense input increases during the transition.

In examples, an electrical path 128 may be arranged between connections 5 and 6 to reduce the glitch. The path 128 between connections 5 and 6 may be located within the package 150 (as shown) or external to the package 150 (not shown). The path 128 may allow the power supply sense input to receive the indication of the voltage input at the DUT 106 during the transition of the switches 112, 114 from one state to another. The power supply sense input may not float and the power supply 102 may provide a voltage output in accordance with the indication of the voltage input at DUT 106 until the switches 112, 114 are either in one state or the other state shown by paths A or B in each state. The path 128 may reduce the glitch in the output of the power supply 102.

Figure 2:
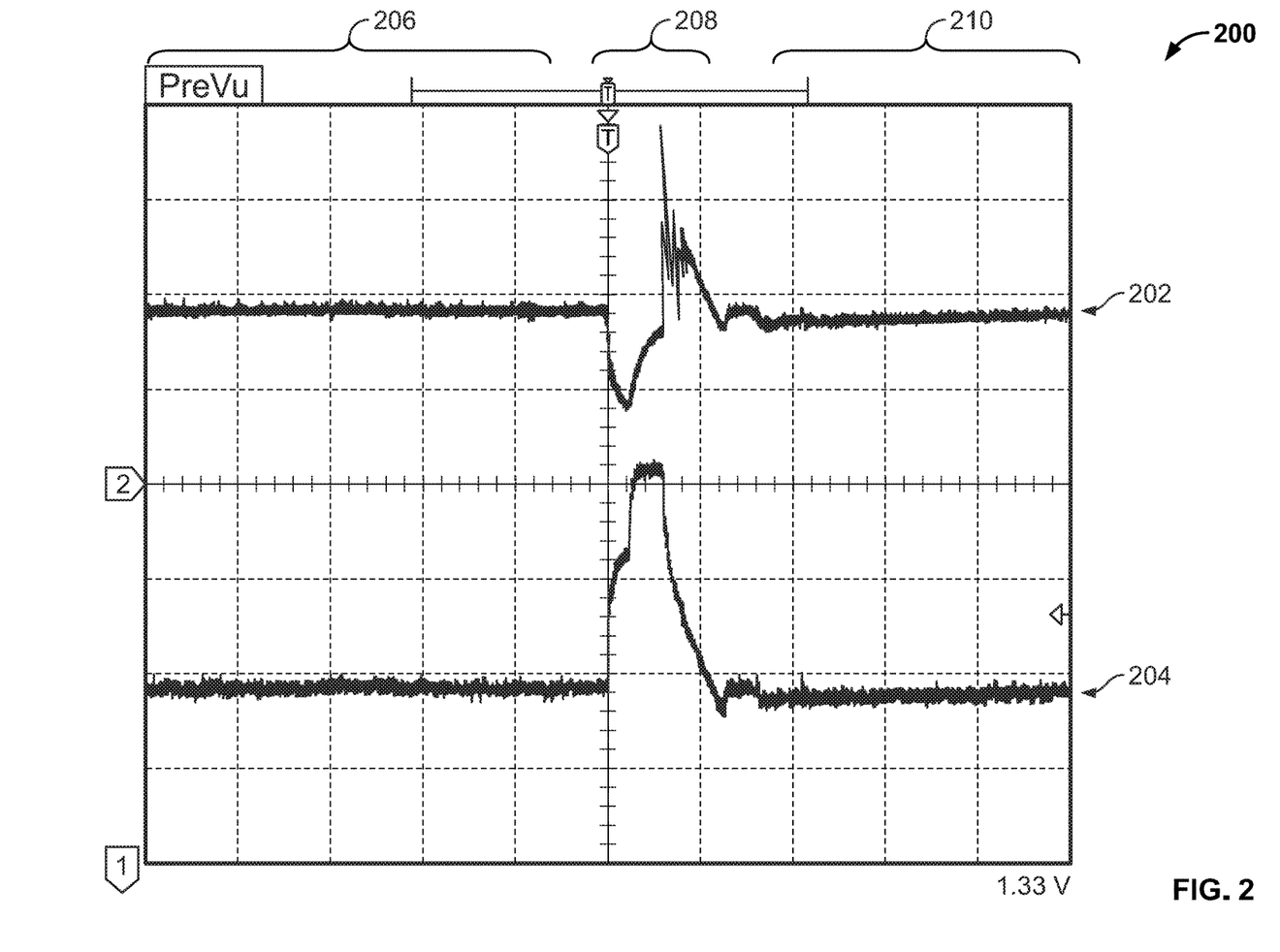
FIG. 2 illustrates an example glitch in the voltage output by the power supply as a relay circuit switches from one state to another state.

FIG. 2 illustrates an example glitch plot 200 in an output of the power supply as the relay circuit switches between states. Plot 202 shows a signal received at the power supply sense input and plot 204 shows the voltage output by the power supply. The switches may be off in a first time range 206, on in a second time range 210, and in transition between off and on in a third time range 208. During the third time range 208, the power supply sense input may float, shown in the example as a drop in voltage which causes the voltage output of the power supply to increase (e.g, overshoot) from the voltage output in the first time range 206. The overshoot may be a glitch in the power supply which remains until the switches are on in the second time range 210 and the power supply sense input is no longer floating. The path 128 between connections 5 and 6 of the relay circuit may reduce any such glitch because the power supply sense input does not float at any time.

Figure 3:
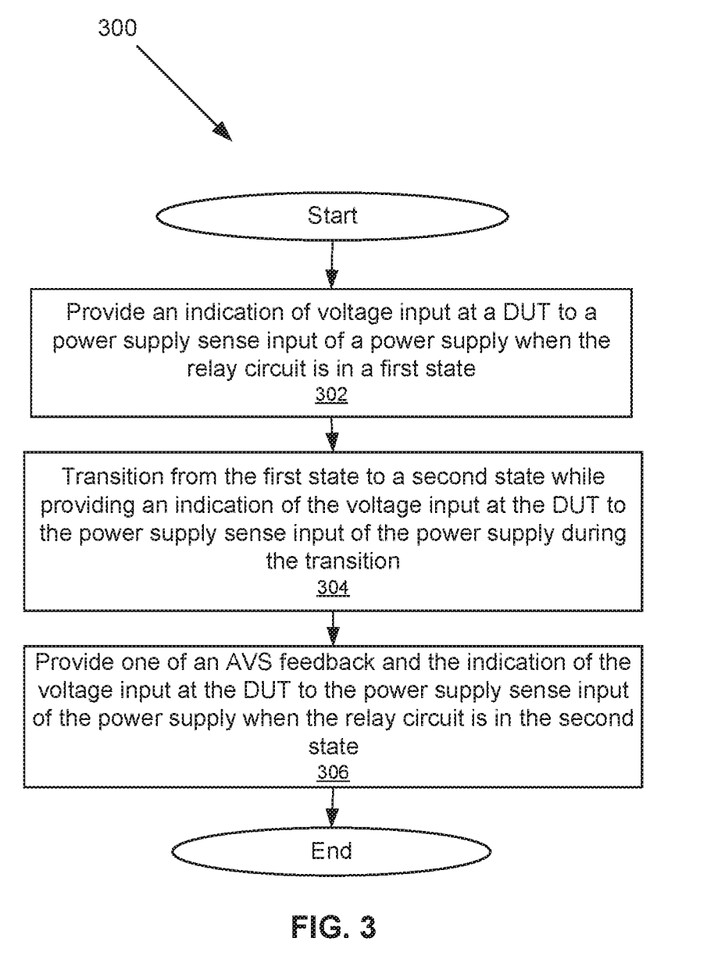
FIG. 3 is an example flow chart of functions associated with reducing the glitch in the voltage output when the signal provided to the power supply sense input of the power supply is initially an indication of the voltage input at the DUT.

FIG. 3 is an example flow chart 300 of functions associated with reducing the glitch in the voltage output when the signal provided to the power supply sense input of the power supply is initially the indication of the voltage input at the DUT. The functions may be performed by the relay circuit in hardware, software, and/or a combination of hardware and software.

At 302, a relay circuit provides an indication of a voltage input at a DUT to a power supply sense input of a power supply when the relay circuit is in a first state. A switch of the relay circuit may couple a voltage input at the DUT to a power supply sense input of the power supply. Additionally, in some examples, a switch of the relay circuit may couple an AVS feedback of the DUT to a parametric test of the ATE. In this first state, the power supply outputs a voltage to the DUT based on the indication of the voltage input at the DUT provided to the power supply sense input. The power supply may adjust the voltage output until the indication of the voltage input at the DUT provided to the power supply sense input meets a desired voltage. The adjustment may include increasing or decreasing the voltage output.

At 304, a relay circuit transitions from the first state to a second state while providing an indication of the voltage input at the DUT to the power supply sense input of the power supply during the transition. A voltage applied to the coil may cause the relay circuit to transition from the first state to the second state. The switch of the relay circuit which initially provides the indication of the voltage input at the DUT to the power supply sense input of the power supply may provide the indication of the voltage input at the DUT to a resistor coupled to the power supply sense input in the second state. Additionally, a switch of the relay circuit which initially provides the AVS feedback to the parametric test of the ATE may provide the AVS feedback to the power supply sense input in the second state. A power supply sense input may be provided an indication of the voltage input at the DUT as the relay circuit transitions from the first state to the second state. In turn, the power supply may output a voltage based on the indication of the voltage input at the DUT provided to the power supply sense input.

At 306, the relay circuit provides one of an AVS feedback and the indication of the voltage input at the DUT to the power supply sense input of the power supply when the relay circuit is in the second state. The power supply sense input receives the AVS feedback when the relay is in the second state. Further, the power supply may output a voltage based on the AVS feedback. The power supply sense input receives the AVS feedback so long as the AVS feedback is enabled. If the AVS feedback is not enabled, then the power supply sense input receives the indication of the voltage input at the DUT and the power supply may output a voltage based on this signal. This way the power supply sense input may not float.

Figure 4:
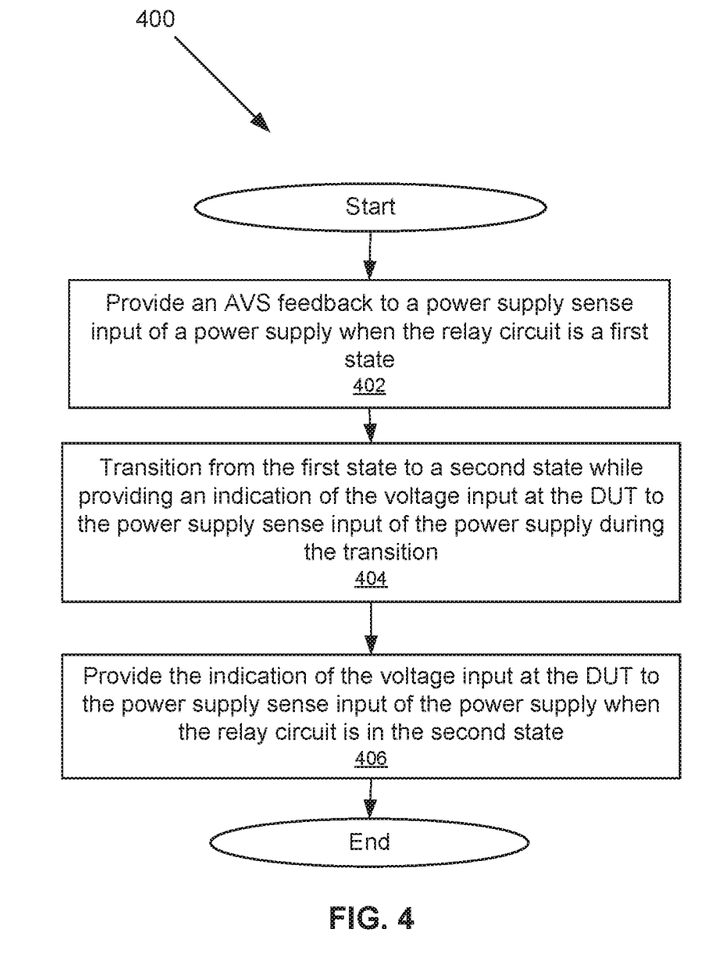
FIG. 4 is an example flow chart of functions associated with reducing the glitch in the voltage output when the signal provided to the power supply sense input of the power supply is initially the AVS feedback.

FIG. 4 is an example flow chart of functions 400 associated with reducing the glitch in the voltage output when the signal provided to the power supply sense input of the power supply is initially an AVS feedback. The functions may be performed by the relay circuit in hardware, software, and/or a combination of hardware and software.

At 402, a relay circuit provides an AVS feedback to a power supply sense input of a power supply when the relay circuit is in a first state. For example, a switch of the relay circuit may provide an indication of the voltage input at the DUT to a resistor coupled to the power supply sense input of the power supply. Additionally, a switch of the relay circuit may provide the AVS feedback to the power supply sense input. The AVS may be enabled. In this regard, the power supply sense input receives the AVS feedback output. The power supply may output a voltage based on the signal provided to power supply sense input and adjust the voltage output until the signal provided to the power supply sense input meets a desired voltage. The adjustment may include increasing or decreasing the voltage output.

At 404, the relay circuit transitions from the first state to a second state while providing an indication of voltage input at the DUT to the power supply sense input of the power supply during the transition. The relay circuit may provide the indication of the voltage input at the DUT to the power supply sense input in the second state. The relay may transition from the first state to the second state based on a voltage applied to the coil which causes the switch of the relay circuit which initially provided the indication of the voltage input at the DUT to a resistor coupled to the power supply sense input to provide the indication of the voltage input at the DUT to the power supply sense input in the second state. Additionally, a switch of the relay circuit which initially provides the AVS feedback to the power supply sense input may provide the AVS feedback to the parametric test input of the ATE in the second state. A power supply sense input may be provided the indication of the voltage input at the DUT as the relay circuit transitions from the first state to the second state. In turn, the power supply may output a voltage based on the indication of the voltage input at the DUT provided to the power supply sense input.

At 406, the relay circuit provides the indication of the voltage input at the DUT to the power supply sense input of the power supply when the relay circuit is in the second state. The power supply sense input may receive the indication of the voltage input at the DUT when the relay is in the second state. Further, the power supply may output a voltage based on the indication of the voltage input at the DUT provided to the power supply sense input.

The relationship between the switches being in the open state and closed state, and the coil respectively in the off state and on state is provided as an example. In other examples, the switches may be in the open state and closed state, and the coil respectively in the on state and off state without any loss of generality.

A few implementations have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof: including potentially a program operable to cause one or more data processing apparatus such as a processor to perform the operations described (such as a program encoded in a non-transitory computer-readable medium, which can be a memory device, a storage device, a machine-readable storage substrate, or other physical, machine readable medium, or a combination of one or more of them).

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

Other implementations fall within the scope of the following claims.

What is claimed is:

1. A system comprising:
    a power supply configured to adjust a voltage supplied to a device under test (DUT) based on one of (i) an input voltage of the DUT supplied to a power supply sense input of the power supply and (ii) a feedback signal indicative of an internal voltage of the DUT supplied to the power supply sense input; and
    a relay circuit configured to transition between (i) supplying the input voltage to the power supply sense input and (ii) supplying the feedback signal to the power supply sense input, wherein, when supplying the feedback signal to the power supply sense input, the relay circuit establishes an electrical path between the input voltage and the power supply sense input to prevent the power supply sense input from floating during the transition.

2. The system of claim 1, wherein the relay circuit further comprises a coil.

3. The system of claim 2, wherein a voltage is applied across the coil to cause the relay circuit to transition between (i) supplying the input voltage to the power supply sense input and (ii) supplying the feedback signal to the power supply sense input.

4. The system of claim 2, further comprising automatic test equipment (ATE) which outputs a voltage to the coil when the relay circuit is supplying the feedback signal to the power supply sense input.

5. The system of claim 4, wherein the relay circuit provides the feedback signal to a parametric test input of the ATE when the relay circuit is supplying the input voltage to the power supply sense input.

6. The system of claim 1, further comprising a loadboard, wherein the loadboard further comprises a power plane to provide the voltage to the DUT, and the DUT is coupled to the power plane by a trace though a via of the loadboard to the power plane.

7. The system of claim 1, wherein the input voltage is provided to the power supply sense input when the feedback signal is floating.

8. The system of claim 1, wherein the feedback signal is an adaptive voltage scaling (AVS) feedback signal.

9. The system of claim 1, wherein the power supply sense input is not floating when the relay circuit is supplying the input voltage to the power supply sense input, supplying the feedback signal to the power supply sense input, and transitioning between supplying the input voltage to the power supply sense input and supplying the feedback signal to the power supply sense input.

10. The system of claim 1, wherein, to establish the electrical path to prevent the power supply sense input from floating, the input voltage is provided to a resistor coupled to the power supply sense input.

11. A relay circuit comprising:
a first switch arranged to provide a voltage input at a device under test (DUT) to a power supply sense input of a power supply and to a resistor coupled to the power supply sense input;
a second switch arranged to provide an AVS feedback of the DUT to the power supply sense input of the power supply,
wherein the relay circuit is configured to transition between a first state and a second state each defining respective positions of the first switch and the second switch,
wherein, in the first state, the first switch connects the voltage input at the DUT to the power supply sense input,
wherein, in the second state, the first switch connects the voltage input at the DUT to the resistor and the second switch connects the AVS feedback of the DUT to the power supply sense input, and
wherein the relay circuit includes an electrical path connecting the voltage input at the DUT to the resistor independent of the first switch and the second switch during a transition between the first state and the second state.

12. The relay circuit of claim 11, wherein the relay circuit further comprises a coil.

13. The relay circuit of claim 11, wherein the voltage input at the DUT is provided to the power supply sense input when the AVS feedback is floating in the second state.

14. The relay circuit of claim 11, wherein the power supply sense input is not floating when the relay circuit is in the first state, the second state, and the transition between the first state and the second state.

15. The relay circuit of claim 11, wherein the AVS feedback is provided to a resistor coupled to an input of the second switch.

16. A method for operating a relay circuit configured to transition between a first state and a second state, the method comprising:
providing a first signal to a power supply sense input of a power supply while the relay circuit is in the first state;
transitioning the relay circuit from the first state to the second state while providing the first signal to the power supply sense input of the power supply during the transition; and
providing one of the first signal and a second signal to the power supply sense input of the power supply in the second state, wherein providing one of the first signal and the second signal to the power supply sense input of the power supply in the second state comprises providing the first signal to the power supply sense input when the second signal is floating in the second state.

17. The method of claim 16, further comprising transitioning from the second state to the first state while providing the first signal to the power supply sense input of the power supply during the transition.

18. The method of claim 16, wherein the first signal is indicative of a voltage input at a DUT and the second signal is an AVS feedback.

19. The method of claim 16, wherein the power supply sense input is not floating in the first state, the second state, and the transition between the first state and the second state.

* * * * *